United States Patent
Zorn et al.

(10) Patent No.: US 9,992,920 B1
(45) Date of Patent: Jun. 5, 2018

(54) METHOD FOR ACCURATE POPULATION OF A CIRCUIT CARRIER

(71) Applicant: ZKW GROUP GMBH, Wieselburg (AT)

(72) Inventors: Jürgen Zorn, Rossatz (AT); Dietmar Kieslinger, Theresienfeld (AT)

(73) Assignee: ZKW GROUP GMBH, Wieselburg (AT)

( * ) Notice: Subject to any disclaimer, the term of this patent is extended or adjusted under 35 U.S.C. 154(b) by 0 days. days.

(21) Appl. No.: 15/579,663

(22) PCT Filed: Jun. 2, 2016

(86) PCT No.: PCT/AT2016/050173
§ 371 (c)(1),
(2) Date: Dec. 5, 2017

(87) PCT Pub. No.: WO2016/197166
PCT Pub. Date: Dec. 15, 2016

(30) Foreign Application Priority Data

Jun. 9, 2015 (AT) .............................. A 50469/2015

(51) Int. Cl.
*H05K 13/08* (2006.01)
*H05K 3/30* (2006.01)
(Continued)

(52) U.S. Cl.
CPC ............ *H05K 13/08* (2013.01); *F21S 41/141* (2018.01); *F21S 41/657* (2018.01); *G01B 11/14* (2013.01);
(Continued)

(58) Field of Classification Search
CPC ........ H05K 13/08; H05K 1/181; H05K 3/303; H05K 2201/10106; H05K 2203/166;
(Continued)

(56) References Cited

U.S. PATENT DOCUMENTS

| 4,755,053 A | 7/1988 | Levinson et al. |
| 5,173,759 A | 12/1992 | Anzaki et al. |

(Continued)

FOREIGN PATENT DOCUMENTS

| EP | 1003212 A2 | 5/2000 |
| EP | 2327582 A2 | 6/2011 |

(Continued)

OTHER PUBLICATIONS

International Preliminary Report on Patentability for PCT/AT2016/050173, dated Aug. 31, 2017 (15 pages).

(Continued)

*Primary Examiner* — Joseph L Williams
*Assistant Examiner* — Jose M Diaz
(74) *Attorney, Agent, or Firm* — Eversheds Sutherland (US) LLP

(57) ABSTRACT

A method for accurate population of a circuit carrier (2) with at least one electronic component (1) which comprises at least two separately controllable light-emitting surfaces (3a, 3b, 3c), having the following steps: a) optically detecting current positions of the at least two light-emitting surfaces (3a, 3b, 3c) of the electronic component (1); b) calculating at least one current variable ($S_{ist}$) characterizing the geometric location of the light-emitting surfaces (3a, 3b, 3c) according to the current positions of the at least two light-emitting surfaces (3a, 3b, 3c) of the electronic component (1); c) comparing the at least one current variable ($S_{ist}$) to at least one target variable ($S_{soll}$) for calculating at least one correction variable (k); d) populating the circuit carrier (2) with the at least one electronic component (1) according to the at least one correction variable (k).

15 Claims, 4 Drawing Sheets

Figure 1:
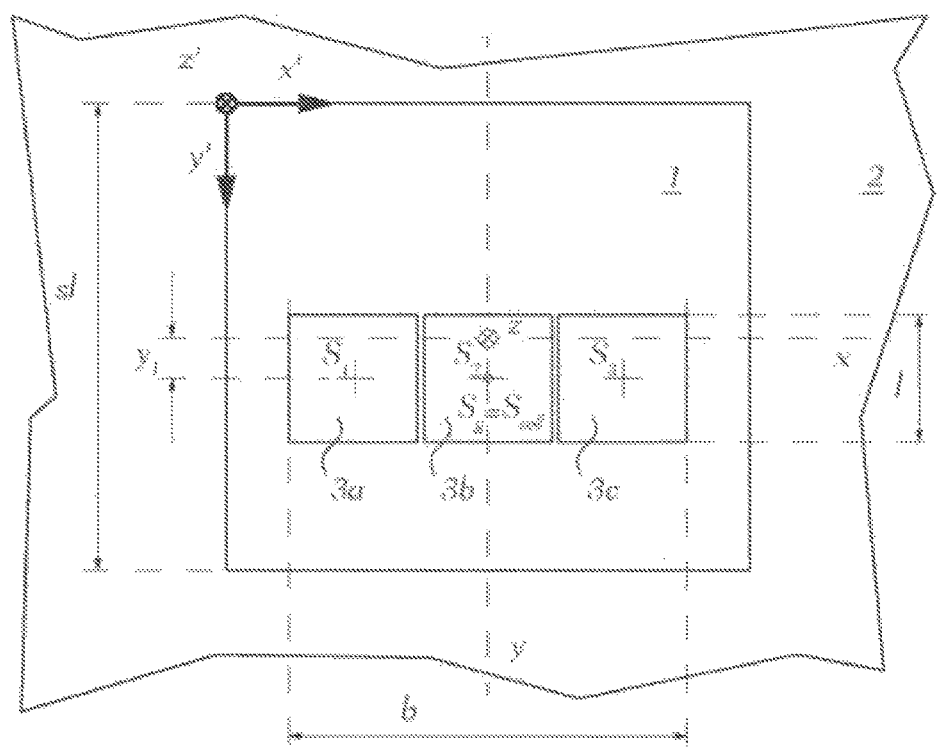

(51) Int. Cl.
    *H05K 1/18*     (2006.01)
    *G01B 11/14*     (2006.01)
    *F21Y 115/00*     (2016.01)

(52) U.S. Cl.
    CPC .............. *H05K 1/181* (2013.01); *H05K 3/303* (2013.01); *F21Y 2115/00* (2016.08); *H05K 2201/10106* (2013.01); *H05K 2203/166* (2013.01)

(58) Field of Classification Search
    CPC ....... F21S 41/141; F21S 41/657; G01B 11/14; F21Y 2115/00
    See application file for complete search history.

(56) References Cited

U.S. PATENT DOCUMENTS

| | | |
|---|---|---|
| 5,249,356 A | 10/1993 | Okuda et al. |
| 5,694,219 A | 12/1997 | Kim |
| 6,040,895 A | 3/2000 | Haas |
| 7,390,681 B1 | 6/2008 | Tristan |
| 2002/0101214 A1* | 8/2002 | Iisaka ................ G05B 19/404 318/600 |
| 2005/0274869 A1 | 12/2005 | Yamauchi et al. |
| 2006/0209910 A1 | 9/2006 | Fukunaga |
| 2009/0021181 A1 | 1/2009 | Brune et al. |
| 2014/0130341 A1* | 5/2014 | Hung ................ H05K 13/0015 29/593 |
| 2015/0364384 A1 | 12/2015 | Karch |

FOREIGN PATENT DOCUMENTS

| | | |
|---|---|---|
| JP | 2013-077648 A | 4/2013 |
| WO | 1998/058403 A1 | 12/1998 |
| WO | 2009/037634 A2 | 3/2009 |
| WO | 2015/000894 A1 | 1/2015 |

OTHER PUBLICATIONS

Office Action issued in Austrian Application No. A 50469/2015, dated Oct. 16, 2015 (5 pages).

\* cited by examiner

METHOD FOR ACCURATE POPULATION OF A CIRCUIT CARRIER

The invention relates to a method for accurate population of a circuit carrier with at least one electronic component which comprises at least two separately controllable light-emitting surfaces.

Furthermore, the invention relates to a circuit carrier with at least one electronic component, wherein the electronic component comprises at least two separately controllable light-emitting surfaces. Moreover, the invention relates to a motor vehicle headlamp having a circuit carrier according to the invention.

Methods for accurate population of a circuit carrier with electronic components, each having exactly one light-emitting surface, have been known in the art.

Various developments in light technology now allow electronic components to be provided with at least two separately controllable light-emitting surfaces. For example, such a component may be the LED light source commercially available under the name "OSLON Black Flat" (KW H3L531.TE model) from the manufacturer OSRAM. This allows to considerably reduce the number of electronic components to be disposed on a circuit carrier, which components may be intended for use in an LED matrix headlamp, for example.

In the assembly of such elements using known methods, the presence of at least two separately controllable light-emitting surfaces on one single electronic component poses the problem that a prerequisite of this method—i.e. that each electronic component has exactly one light-emitting surface—is not satisfied. Therefore, in order to use said methods, one of the at least two light-emitting surfaces would first have to be selected according to criteria to be defined which are not yet known. However, the remaining light-emitting surfaces would be disregarded in this case. As such, if a circuit carrier is populated with electronic components having at least two light-emitting surfaces in a conventional manner, then an optimum orientation of the components and/or light-emitting surfaces cannot be ensured. However, errors in the orientation/position of the light-emitting surfaces can, in particular when used in a motor vehicle headlamp, lead to inadmissible inaccuracies and aberrations in the light pattern of the motor vehicle headlamp.

One objective of the invention is therefore to provide a method for accurate population of a circuit carrier with at least one electronic component which comprises at least two separately controllable light-emitting surfaces.

This objective is achieved by a method of the type mentioned at the beginning, having the following steps according to the invention:

a) optically detecting current positions of the at least two light-emitting surfaces of the electronic component,
b) calculating at least one current variable characterizing the geometric location of the light-emitting surfaces according to the current positions of the at least two light-emitting surfaces of the electronic component,
c) comparing the at least one current variable to at least one target variable for calculating at least one correction variable,
d) populating the circuit carrier with the at least one electronic component according to the at least one correction variable.

Thanks to the invention, it is possible to implement an accurate population of a circuit carrier with at least one electronic component which comprises at least two separately controllable light-emitting surfaces, wherein position errors of two or more light-emitting surfaces on the electronic component can be detected and compensated for by calculating a correction variable.

Optically detecting the current positions of the electronic component is typically accomplished by using a camera system and suitable image processing algorithms, wherein the positions are detected with respect to a reference point which may, for example, be formed on the electronic component or on the circuit carrier. Here, the term "(current) position of a surface" not only means the dimension of the surface, but also its location or spatial orientation with respect to the reference point.

The target variable is typically represented by predefined values regarding the location and orientation of the light-emitting surfaces with respect to the reference point. For example, the target variable is determined from the geometric target position and target dimension of the light-emitting surfaces with respect to the reference point which may be known from a data sheet, for example, or can be calculated. Further details can be found in the description of figures.

The population under item d) of the method is performed by taking the correction variable into account in that, with the aid of the correction variable, a predefined installation position is corrected into an actual installation position, in which the electronic component is applied onto, in particular soldered to, the circuit carrier. The correction variable is determined using a digital computation unit and can be transferred to a population device in digital form.

Thus, it may be contemplated that the current variable characterizing the geometric location of the light-emitting surfaces and the target variable are supplied to, or detected by, a digital computation unit, in which the correction variable is calculated, wherein the correction variable is transferred to a population unit for population according to step d) as a digital information signal.

Preferably, it may be contemplated that the correction variable comprises at least one vector variable, the direction of the vector variable being oriented in parallel to the population surface of the circuit carrier. Therefore, in a Cartesian coordinate system, consisting of axes x, y and z which are orthogonal to one another, in which axes x and y are oriented in parallel to the population surface of the circuit carrier, the vector variable contains information on the magnitude and direction of a vector in the x-y plane. Thus, the population may be corrected in the x- and y-direction.

Moreover, it may be advantageous if the correction variable comprises an angular value for rotation around an axis of rotation z, wherein the axis of rotation z is oriented orthogonally to the population surface of the circuit carrier. Thus, it is possible to change the orientation of the electronic component on the circuit carrier. As a prerequisite, it is, of course, contemplated that the target variable will contain information on a target orientation of the electronic component so that the correction variable can be calculated by comparing the current variable with the target variable.

To detect the orientation of the light-emitting surfaces in a convenient manner, it may be contemplated that the at least one current variable contains information characterizing the profile, in particular the slope, of the visible edges of the light-emitting surfaces. For example, this information may comprise the position of a plurality of points on the edge, which are detected by common edge detection (e.g. by gradient filtering), for example. The location of the edges is of particular importance when used in lighting systems in which the edge profile has a direct impact on the light pattern of the lighting system. For example, this is the case with a motor vehicle headlamp having a low-beam function where no additional mask is provided for defining a cut-off line, but where the cut-off line is, for example, defined by the location of the light-emitting surfaces with respect to an optical system, e.g. a reflector. Other light functions for which defined light-dark transitions are relevant would be exemplified by an adaptive front-lighting function, a fog light function and an adaptive high beam.

Alternatively, it may be contemplated that the at least one current variable comprises information characterizing a virtual centroid of the light-emitting surfaces, wherein the virtual centroid is determined by determining the geometric centers of the individual light-emitting surfaces by taking into account their current positions.

In another version of the invention, it may be contemplated that the at least one current variable comprises information characterizing the dimension and position of a fictitious rectangular surface, wherein the dimensions as well as the position and orientation of the fictitious rectangle are selected such that the ratio between overlap and size of the surface is optimized.

These two latter types of information on the current variable are well-suited for use in the population of circuit carriers adapted to produce a high-beam distribution. This is because the homogeneity of the overall light pattern is of much greater importance there than the profile of individual edges, wherein the light patterns of individual light-emitting surfaces typically overlap each other at least partially so that the profile of individual edges is less important. In addition, these methods are well-suited for the population of circuit carriers incorporated into imaging systems where cut-off lines are formed by additional aids such as masks.

More specifically, it may be contemplated that the target variable comprises position information with respect to a reference point, wherein the reference point is disposed on the electronic component or the circuit carrier of the electronic component. Optically detecting the current position of the light-emitting surfaces here also includes detecting the reference points such that the positions can be measured with respect to the reference points.

In an advantageous implementation of the invention, the light-emitting surfaces may be spaced from one another. Alternatively, the light-emitting surfaces may be disposed on a single converter surface, wherein different areas of the converter surface may be controlled and activated by separately controllable chips.

More specifically, it may be contemplated that the at least one electronic component has a plurality of at least three, four or five light-emitting surfaces which are preferably disposed in a row.

It may be particularly advantageous if the electronic component is an LED, preferably an SMD-LED.

To be able to optically detect the light-emitting surfaces more easily, it may be advantageous to illuminate the light-emitting surface with an external light source during step a).

In particular, the light-emitting surfaces may be excited to emit light during step a). The excitation may either be accomplished by illumination of sufficient intensity by an external light source or also by activation of the electronic component.

In another aspect, the invention relates to a circuit carrier with at least one electronic component, wherein the electronic component has at least two separately controllable light-emitting surfaces, characterized in that population of the circuit carrier with at least one electronic component according to the current positions of the at least two light-emitting surfaces of the electronic component is performed according to the method of the invention as discussed at the beginning.

Moreover, the invention relates to a motor vehicle headlamp with a circuit carrier according to the invention.

Figure 2:
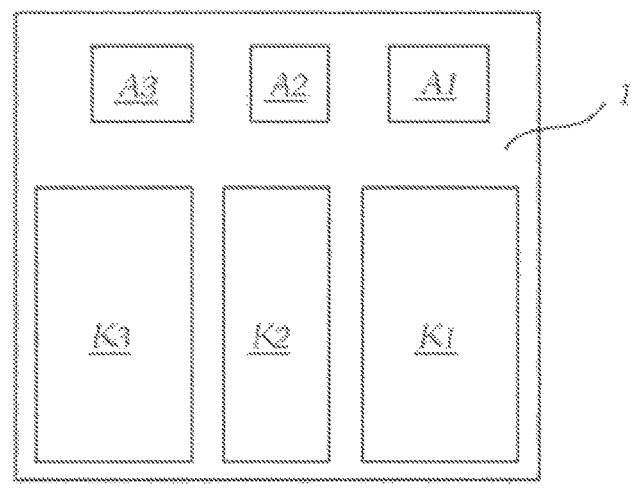
Figure 3:
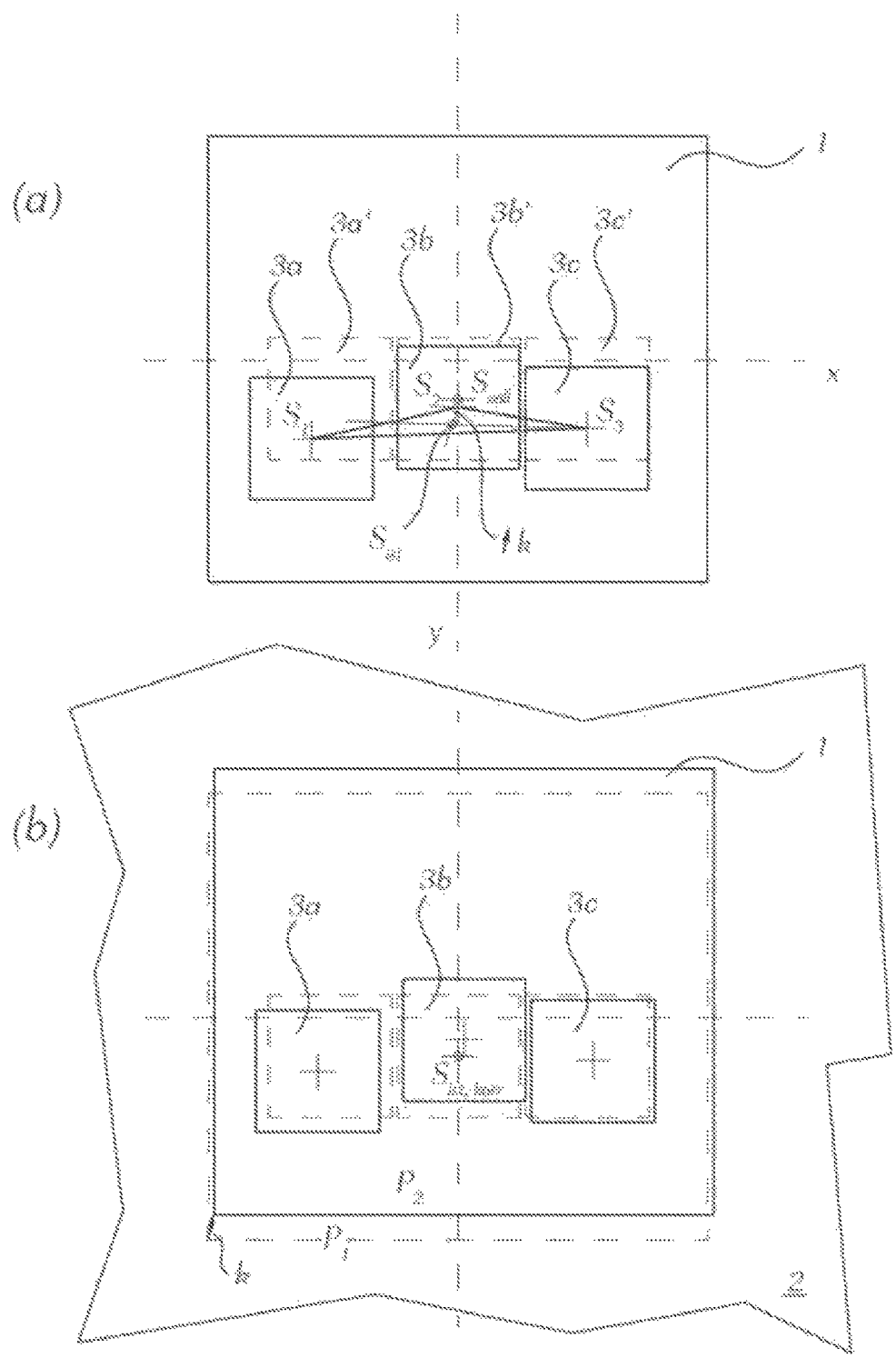
Figure 4:
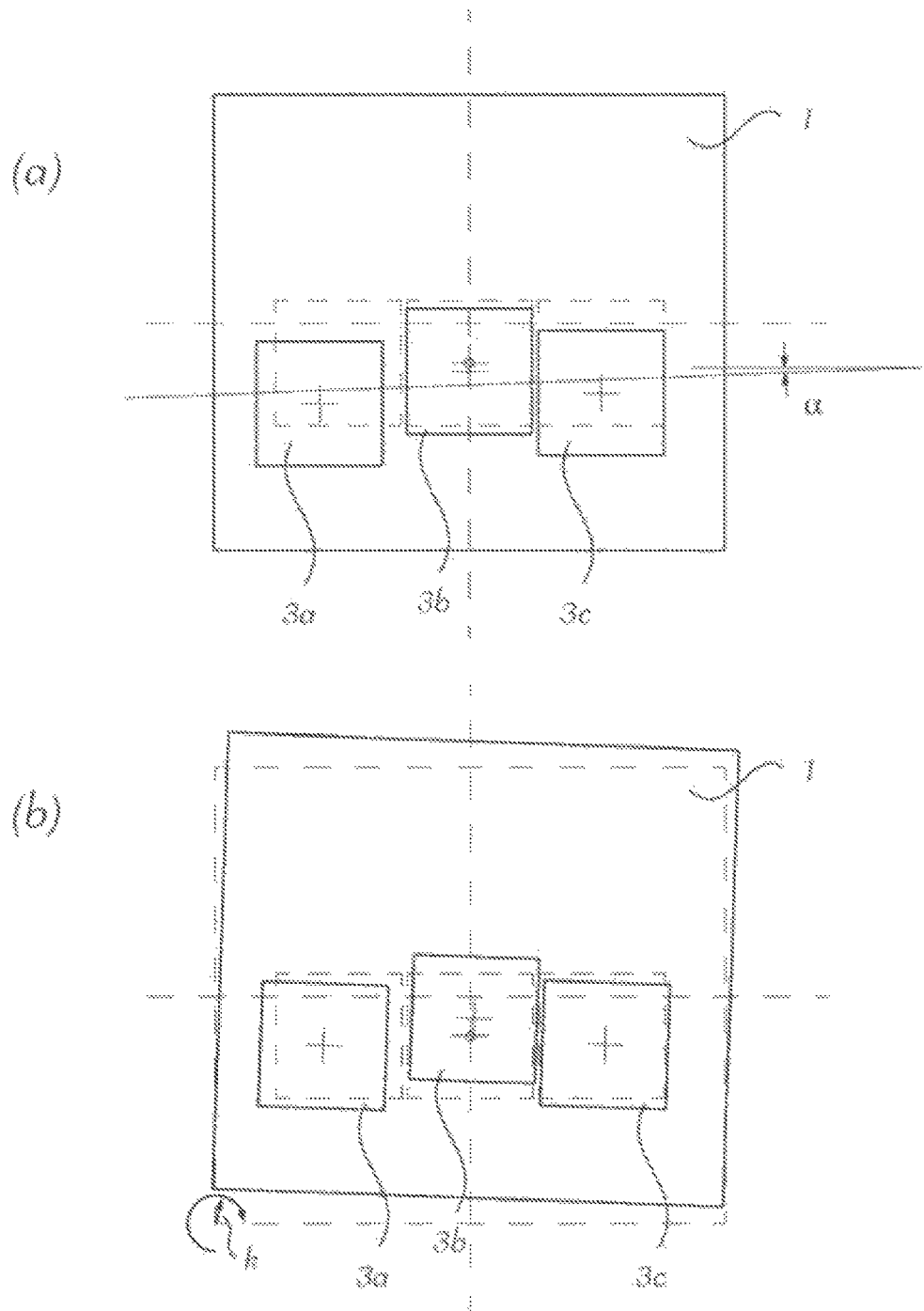
Figure 5:
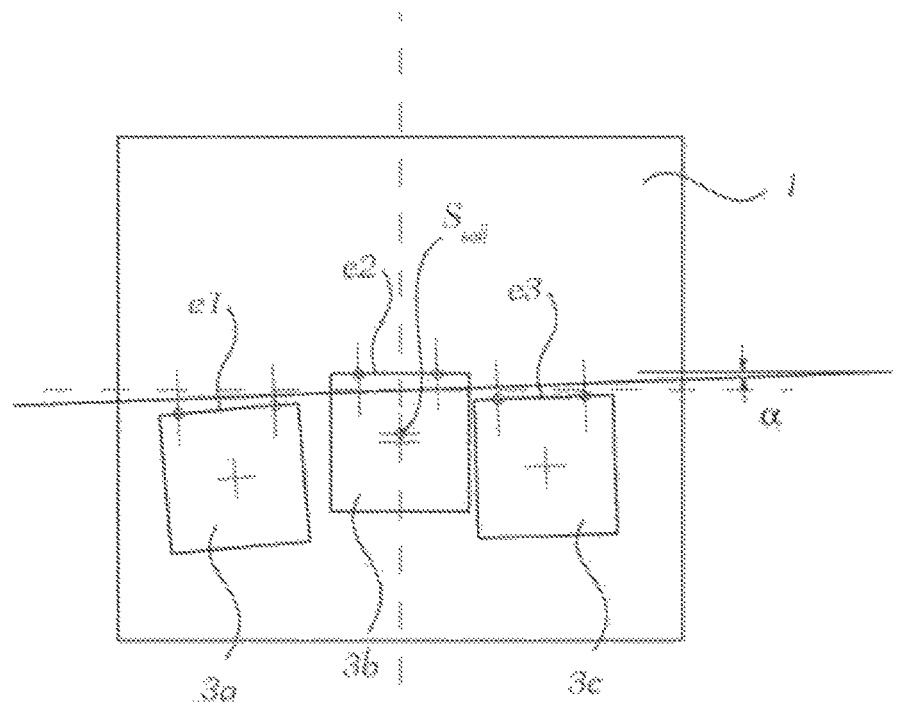
Figure 6:
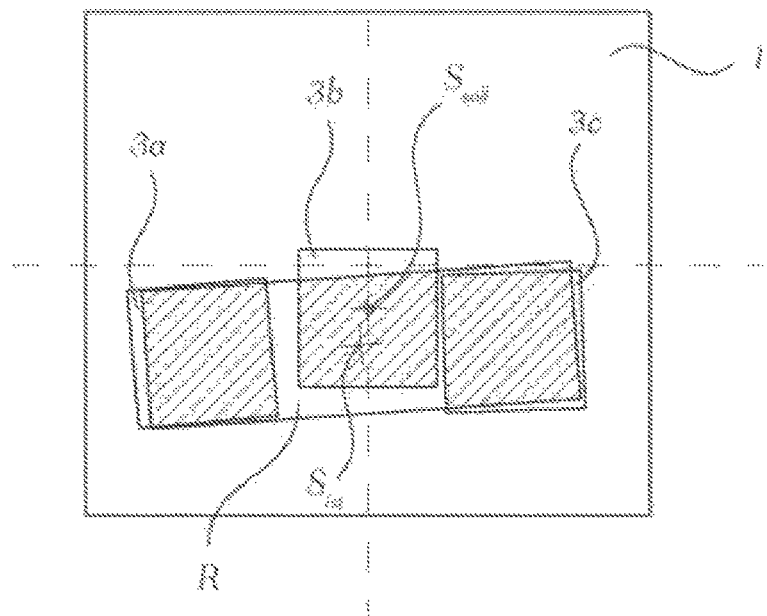

The invention is explained in greater detail below with reference to an exemplary and non-limiting embodiment illustrated in the figures. Therein, FIG. 1 shows a schematic representation of a fictitious electronic component on a section of a circuit carrier, FIG. 2 shows a representation of the rear of the electronic component, FIGS. 3a and 3b show a representation of a real electronic component with incorrectly aligned light-emitting surfaces and a measure to eliminate the error, FIGS. 4a and 4b show a representation of the electronic components of FIG. 3a and another measure to eliminate the error, FIG. 5 shows another electronic component with incorrectly aligned light-emitting surfaces and another measure to eliminate the error, FIG. 6 shows the electronic component of FIG. 5 and another measure to eliminate the error.

FIG. 1 shows a schematic representation of a fictitious (derived from the data sheet) electronic component 1 on a section of a circuit carrier 2 which was populated with electronic component 1 (fictitious). In the present example, electronic component 1 has three separately controllable light-emitting surfaces 3a, 3b and 3c. From this fictitious example, a target variable can be determined in advance against which the optically determined current variable can be compared during the actual population process.

Individual position information relates to the Cartesian coordinate system, consisting of axes x, y and z, wherein axes x and y are oriented in parallel to the plane of the light-emitting surfaces and axis z protrudes into the sheet plane. The choice of the coordinate system and its location may be freely determined by one skilled in the art as long as a clear definition of the location of the light-emitting surfaces 3a, 3b and 3c is possible. Thus, a Cartesian coordinate system x', y', z' could also be employed, the origin of which lies in a corner of the housing of electronic component 1. Such corners may often be detected particularly easily by optical detection methods and downstream image processing algorithms. The origin of the selected coordinate system constitutes the reference point for position information.

In the exemplary embodiment shown, the light-emitting surfaces 3a, 3b und 3c have a square shape with a side length 1. They are disposed in a row and spaced from one another. The exemplified electronic component 1 is the model of the "OSLON Black Flat" series mentioned at the beginning, wherein the housing of the electronic component has a side length sl in the x- and y-direction of between 2 and 10 mm and the width b of the row of light-emitting surfaces 3a, 3b und 3c is between approximately 1.5 and 9 mm.

The light-emitting surfaces 3a, 3b und 3c each have centers or centroids $S_1$, $S_2$ and $S_3$, wherein these are offset with respect to the zero point of the coordinate system x, y, z. Thus, all three centroids $S_1$, $S_2$ and $S_3$ have an offset y1 (e.g. between 0.1 and 0.6 mm, these values are derived from the data sheet) in the direction of the y-axis. In addition, centroids $S_1$ and $S_3$ are offset towards/in x-direction relative to the zero point of the coordinate system x, y and z. From the location of the individual light-emitting surfaces 3a, 3b and 3c and/or the centroids $S_1$, $S_2$ and $S_3$, an overall centroid $S_g$ (referred to as a virtual centroid in the claims) can be calculated which coincides with the target centroid $S_{soll}$—as the data of electronic component 1, as shown, corresponds to the target values (without tolerances). This target centroid $S_{soll}$ can be used as the target variable in the method according to the invention.

FIG. 2 shows a representation of the rear of electronic component 1, wherein the contact surfaces of anodes A1 to A3 and cathodes K1 to K3 are shown therein, which are associated with individual chips, preferably LED chips, configured to control light-emitting surfaces 3a, 3b and 3c. After population of circuit carrier 2 with electronic component 1, sufficient contact must be established between the cathode and anode surfaces and corresponding surfaces on the circuit carrier. For this purpose, the contact surfaces may, for example, be coated, in particular printed, with solder paste and secured to electronic component 1 in a reflow soldering process.

FIGS. 3a and 3b show a representation of a real electronic component 1 where light-emitting surfaces 3a, 3b and 3c are not disposed in the target positions derived from the data sheet (indicated by dashed surfaces 3a', 3b' and 3c'), but exhibit deviations therefrom. Light-emitting surfaces 3a, 3b and 3c all have an offset in the direction of the y-axis. Moreover, the first light-emitting surface 3a is offset outwardly against the direction of the x-axis. In contrast to electronic component 1 in accordance with the data sheet (see FIG. 1), the individual centroids $S_1$, $S_2$ und $S_3$ of light-emitting surfaces 3a, 3b and 3c are no longer disposed on a common line. FIG. 3a now shows a way to determine a current variable (in this example a position) associated with the offset light-emitting surfaces 3a, 3b and 3c, which may be compared with a target variable $S_{soll}$, i.e. the desired location of the overall centroid.

For this purpose, a self-contained geometric shape is defined, the corner points of which are formed by the centroids of the individual light-emitting surfaces. In this example, centroids $S_1$, $S_2$ and $S_3$ form a triangle which is shown schematically. The centroid of this triangle may either be determined geometrically by the medians indicated in FIG. 3a or mathematically and corresponds to the overall centroid of light-emitting surfaces 3a, 3b and 3c and can be used as current variable $S_{ist}$. According to step c) of the method of the invention, current variable $S_{ist}$ can now be compared to target variable $S_{soll}$ to determine a correction variable therefrom. In this example, the target variable contains coordinates on the x- and y-position of the overall target centroid and the current variable contains coordinates on the x- and y-position of the overall current centroid. By obtaining the difference between the coordinates of $S_{soll}$ and $S_{ist}$, the correction variable k may be calculated in the form of a vector which can be used to correct the population position of electronic component 1 on circuit carrier 2.

This process is exemplified in FIG. 3a, in which a predefined population position, position P1, has been corrected into an actual population position P2 by displacing the electronic component by a vector of correction variable k such that the position of the corrected overall centroid $S_{ist,korr}$ is consistent with position $S_{soll}$. This process corresponds to step d) of the method according to the invention.

The examples according to FIGS. 4a, 4b, 5 and 6 address other and, where appropriate, alternative aspects of the invention and illustrate that the method of the invention is widely applicable and not limited to the version according to FIGS. 3a and 3b.

Thus, FIG. 4a shows electronic component 1 according to FIG. 3a, wherein another way to correct the location of light-emitting surfaces 3a, 3b and 3c is illustrated. Here, a regression line is placed between the individual centroids $S_1$, $S_2$ and $S_3$, wherein the slope $\alpha$ of the regression line is assessed with respect to the x-axis (or y-axis) and the position of electronic component 1 according to FIG. 4b is corrected by displacing electronic component 1 according to FIG. 3b and additionally rotating it about the z-axis by an angle $\alpha$. In this example, correction variable k therefore comprises both a vector variable, comprising the coordinates of the displacement in the x- and y-direction, and an angular value, i.e. angle $\alpha$, indicating a rotation about axis z.

FIG. 5 shows another real electronic component 1 with incorrectly disposed light-emitting surfaces 3a, 3b and 3c and another measure to eliminate the error. Here, edges e1, e2 and e3 of light-emitting surfaces 3a, 3b und 3c are optically detected, for which purpose the location of at least two points on edges e1, e2 and e3 must be established. The location and profile of the edges can be determined such that, similar to the method according to FIGS. 4a and 4b, a regression line can be calculated, the slope $\alpha$ of which can be used to correct the actual population position of electronic component 1. The correction of the orientation of edges e1, e2 and e3 of light-emitting surfaces 3a, 3b und 3c is primarily relevant for motor vehicle headlamp modules where the individual light sources are reproduced sharply in the light pattern of the headlamp, as is the case with maintaining cut-off lines for low beam, adaptive high beam, adaptive front-lighting and fog light modules, for example, in which the low-beam distribution is defined by the location of the light sources with respect to and in relation to a reflector.

FIG. 6 shows another measure for electronic component 1 according to FIG. 5 to eliminate the incorrect position of light-emitting surfaces 3a, 3b and 3c. For this purpose, current variable $S_{ist}$ comprises information characterizing the dimensions and position of a fictitious rectangular surface R, wherein the dimensions as well as the position and orientation of the fictitious rectangle R are selected such that the ratio between overlap and size of the surface is optimized. In a most simple version of this method, it may be contemplated that rectangle R is determined based on the positions and dimensions of light-emitting surfaces 3a, 3b and 3c of electronic component 1 according to FIG. 1 and the rectangle R thus obtained is positioned and oriented such that the surface overlap with light-emitting surfaces 3a, 3b and 3c is at a maximum. In turn, the location of the centroid and the orientation of rectangle R can be used to correct the population position of electronic component 1.

The term "characterizing information" often used in the claims merely means that suitable variables or fields are used to identify the relevant information which are suitable to reflect and clearly define the relevant information. For example, information characterizing the position and orientation of fictitious rectangular surface R may be indicated by a field in which entries on the length, width, position and orientation of rectangle R are indicated.

The improvement of the location of overall centroid $S_g$ of light-emitting surfaces 3a, 3b and 3c is particularly relevant for high-beam functions or for all other functions where cut-off lines are defined using additional aids such as masks.

The exemplary embodiments shown in FIGS. 1 to 6 disclose an electronic component 1 with three light-emitting surfaces 3a, 3b and 3c. It is understood that the number of light-emitting surfaces may deviate from the number shown. Similarly, the geometric shape of the light-emitting surfaces may deviate from the shapes shown.

To recognize light-emitting surfaces 3a, 3b and 3c more easily, it may be contemplated that they are illuminated by an external light source during step a), by which the contrast of light-emitting surfaces 3a, 3b and 3c to surrounding surfaces can be improved. This external light source preferably emits blue light onto light-emitting surfaces 3a, 3b and 3c. Depending on whether a quick optical detection is critical (e.g. for rapid population), it may be contemplated that the wavelength and intensity of the light emitted by the external light source are selected such that light-emitting surfaces 3a, 3b and 3c are excited to emit light.

In view of this teaching, one skilled in the art is able to obtain other embodiments of the invention which are not shown. Hence, the invention is not limited to the embodiments shown. Moreover, individual aspects of the invention or the embodiments may be taken up and combined with one another. What is essential are the ideas underlying the invention which may be implemented by one skilled in the art in multiple ways having regard to this description and still be maintained as such.

The invention claimed is:

1. A method for accurate population of a circuit carrier (2) with at least one electronic component (1) which comprises at least two separately controllable light-emitting surfaces (3a, 3b, 3c), by which position errors of the light-emitting surfaces (3a, 3b, 3c) on the electronic component are detected and compensated for by calculating a correction variable (k), the method comprising:
   a) optically detecting current positions of the at least two light-emitting surfaces (3a, 3b, 3c) of the electronic component (1) with respect to a reference point;
   b) calculating at least one current variable ($S_{ist}$) characterizing the geometric location of the light-emitting surfaces (3a, 3b, 3c) according to the current positions of the at least two light-emitting surfaces (3a, 3b, 3c) of the electronic component (1);
   c) comparing the at least one current variable ($S_{ist}$) to at least one target variable ($S_{soll}$) for calculating at least one correction variable (k), wherein the target variable ($S_{soll}$) is represented by predefined values regarding the location and orientation of the light-emitting surfaces (3a, 3b, 3c) with respect to the reference point;
   d) populating the circuit carrier (2) with the at least one electronic component (1) according to the at least one correction variable (k).

2. The method of claim 1, wherein the current variable ($S_{ist}$) and the target variable ($S_{soll}$) are supplied to, or detected by, a digital computation unit in which the correction variable (k) is calculated, wherein the correction variable (k) is transferred to a population device as a digital information signal for population according to step d).

3. The method of claim 1, wherein the correction variable (k) comprises at least one vector variable, wherein the direction of the vector variable is oriented in parallel to the population surface of the circuit carrier (2).

4. The method of claim 3, wherein the correction variable (k) also comprises an angular value for rotation about an axis of rotation (z), wherein the axis of rotation is oriented orthogonally to the population surface of the circuit carrier (2).

5. The method of claim 1, wherein the at least one current variable ($S_{ist}$) comprises information characterizing the profile, in particular the slope, of the visible edges of the light-emitting surfaces (3a, 3b, 3c).

6. The method of claim 1, wherein the at least one current variable ($S_{ist}$) comprises information characterizing a virtual centroid ($S_g$) of the light-emitting surfaces (3a, 3b, 3c), wherein the virtual centroid ($S_g$) is determined by determining the geometric centers ($S_1$, $S_2$, $S_2$) of the individual light-emitting surfaces (3a, 3b, 3c) by taking into account their current positions.

7. The method of claim 1, wherein the at least one current variable ($S_{ist}$) comprises information characterizing the dimensions and position of a fictitious rectangular surface, wherein the dimensions as well as the position and orientation of the fictitious rectangle (R) are selected such that the ratio between overlap and size of the surface is optimized.

8. The method of claim 1, wherein the target variable ($S_{soll}$) comprises a position information with respect to a reference point, wherein the reference point is disposed on the electronic component (1) or the circuit carrier (2) of the electronic component (1).

9. The method of claim 1, wherein the light-emitting surfaces (3a, 3b, 3c) are spaced from one another.

10. The method of claim 1, wherein the at least one electronic component (1) has a plurality of at least three, four or five light-emitting surfaces (3a, 3b, 3c) which are preferably disposed in a row.

11. The method of claim 1, wherein the electronic component (1) is an LED, preferably an SMD-LED.

12. The method of claim 1, wherein the light-emitting surfaces (3a, 3b, 3c) are illuminated by an external light source during step a).

13. The method of claim 1, wherein the light-emitting surfaces (3a, 3b, 3c) are excited to emit light during step a).

14. A circuit carrier (2) with at least one electronic component (1), wherein the electronic component (1) has at least two separately controllable light-emitting surfaces (3a, 3b, 3c), wherein populating the circuit carrier (2) with the at least one electronic component (1) according to the current positions of the at least two light-emitting surfaces (3a, 3b, 3c) of the electronic component (1) is performed according to the method of claim 1.

15. A motor vehicle headlamp with a circuit carrier (2) of claim 14.

* * * * *